United States Patent [19]

Murakami et al.

[11] Patent Number: 5,690,743
[45] Date of Patent: Nov. 25, 1997

[54] LIQUID MATERIAL SUPPLY APPARATUS AND METHOD

[75] Inventors: Seishi Murakami, Kofu; Tatsuo Hatano, Nirasaki, both of Japan

[73] Assignee: Tokyo Electron Limited, Tokyo-to, Japan

[21] Appl. No.: 496,130

[22] Filed: Jun. 27, 1995

[30] Foreign Application Priority Data

Jun. 29, 1994 [JP] Japan .................................. 6-170082

[51] Int. Cl.⁶ ........................................................ C23C 16/00
[52] U.S. Cl. ........................................ 118/715; 118/726
[58] Field of Search ................................. 118/715, 726

[56] References Cited

U.S. PATENT DOCUMENTS

| 5,203,925 | 4/1993 | Shibuya | 118/724 |
|---|---|---|---|
| 5,250,323 | 10/1993 | Miyazaki | 427/255.1 |
| 5,362,328 | 11/1994 | Gardiner et al. | 118/726 |
| 5,372,754 | 12/1994 | Ono | 261/142 |
| 5,383,970 | 1/1995 | Asaba | 118/726 |
| 5,419,924 | 5/1995 | Nagashima | 427/248.1 |
| 5,443,644 | 8/1995 | Ozawa | 118/715 |
| 5,554,226 | 9/1996 | Okase | 118/724 |
| 5,620,524 | 4/1997 | Fan et al. | 118/726 |

FOREIGN PATENT DOCUMENTS

| 63-12336 | 1/1988 | Japan . | |
|---|---|---|---|
| 5-82507 | 4/1993 | Japan | 118/726 |
| 5-152214 | 6/1993 | Japan | 118/724 |

*Primary Examiner*—Richard Bueker
*Assistant Examiner*—Jeffrie R. Lund
*Attorney, Agent, or Firm*—Beveridge, Degrandi, Weilacher & Young, LLP

[57] ABSTRACT

An apparatus for supplying a low vapor pressure liquid material for deposition to a deposition chamber in which the low vapor pressure liquid material is pushed out of a pressurization passage by a pressure gas to a pressure liquid supply passage; a flow rate of the low vapor pressure liquid material is controlled by a flow rate control unit, and the flow rate of the low vapor pressure liquid is supplied to an evaporator and evaporated into vapor there; and the vapor is fed to the deposition chamber through a vapor feed passage provided with heating means for preventing the vapor from re-liquefying, whereby the liquid material for deposition is supplied stably and accurately.

5 Claims, 6 Drawing Sheets

LIQUID MATERIAL SUPPLY APPARATUS AND METHOD

BACKGROUND OF THE INVENTION

The present invention relates to a liquid material supply apparatus and method for supplying a liquid material to a deposition chamber.

Generally a semiconductor device fabrication process includes depositing films on semiconductor wafers, etching the wafers by micronized processing techniques, and other treatments. By repeating these operations, films are deposited in multi-layers on the wafers.

To deposit films on semiconductor wafers, generally CVD (Chemical Vapor Deposition) apparatuses, sputtering apparatuses, etc. are used. Here, to give an example, the deposition of films by a CVD apparatus will be explained. Semiconductor wafers are placed in a deposition chamber the interior of which is in a vacuum or under the normal pressure. A required deposition gas is supplied into the deposition chamber with the wafers set at a required processing temperature, and a reaction product produced by, e.g., a chemical reaction is deposited on the surfaces of the wafers.

Processing gases used in this film deposition are, e.g., halogen compounds, such as $WF_6$, $TiCl_4$, etc., which are formed by compounding deposition metals with halogen. These compounds are gaseous at the normal temperature and under the normal pressure. In supplying the processing gases, the processing gases which are loaded in processing gas bombs under a primary pressure of, e.g., about 150 $kg/cm^2$ are unloaded out of the bombs down to a secondary pressure of, e.g., 2–5 $kg/cm^2$, and the processing gasses are controlled by a mass flow controller for controlling mass flow rates of the gases provided in a gas box near the deposition chamber to be supplied into the deposition chamber.

For the above-described gaseous deposition materials, the so-called low vapor pressure liquid materials, that are liquid at the normal temperature and under the normal pressure have been recently developed. Such liquid materials presently tend to be more used because of very good film characteristics of their deposited films. The low vapor pressure liquid materials comprise organic metal materials, e.g., diethylaminotitanium $(Ti[N(C_2H_3)_2]_4$, trimethylvinylsilyl-hexafluoroacetylacetate copper (I) ($Cu_8hfac$)vtms), etc.. These materials are harmful to the human body and have a property that they are very reactive and readily oxidized upon contact with air.

To supply the low vapor pressure liquid materials into the deposition chamber, the supply systems for the deposition gases cannot be used because the liquid materials are liquid at the normal temperature and under the normal atmosphere as described above, and are accordingly difficult to evaporate. In view of this, in place of the supply systems are considered systems of bubbling the liquid materials on carriers gases, such as $N_2$ gas, etc. to supply them in mist, or systems of heating the liquid materials to supply them in large amounts of vapor.

But the bubbling system has not only a problem that the supply amount is unstable due to changes in liquid amounts and liquid surface areas, and others, but also a problem that the liquid materials are so difficult to evaporate as described above that the bubbling alone cannot secure sufficient vapor amounts.

In addition, another problem is that $N_2$ gas and $H_2$ gas used in the bubbling are solved even in traces into the liquid materials to be impurities and affect film deposition on wafers.

The heating system can secure necessary vapor amounts, but has a problem that heating of the liquid materials thermally decomposes and modifies the materials themselves.

Furthermore, both systems have problems that the liquid materials which have been once evaporated again liquefy and that residual liquid materials in pipes and connections react with oxygen and produce solid byproducts on replacement of liquid tanks loaded with the liquid materials, and the solid byproducts clog the pipes and connections.

In addition, the liquid materials are supplied into the deposition chamber finally in gases. Their volumes are accordingly much expanded, but their used amounts per hour are small in liquid amounts. In a piping for the liquid materials constituted by pipes of the usual sizes for gases, the material liquids reside longer and are more susceptible to metal contamination of materials of the pipes.

Thus it has been very difficult to supply stably and accurately the low vapor pressure liquid materials from the liquid tank to the deposition chamber.

SUMMARY OF THE INVENTION

In view of the above-described problems, the present invention has been made to effectively solve the problems. An object of the present invention is to provide a liquid material supply apparatus and method which can stably and accurately supply a low vapor pressure liquid material for film deposition.

To solve the above-described problems, the present invention relates to a liquid material supply apparatus for supplying a low vapor pressure liquid material for deposition to a deposition chamber for depositing films on objects to be processed, the apparatus comprising a reservoir for storing the low vapor pressure liquid material; an evaporator for exposing the low vapor pressure liquid material to a high flow rate gas to evaporate the liquid material; a pressurization passage for pushing out the low vapor pressure liquid material by a pressure gas separately supplied by means connected to the reservoir; a pressure liquid supply passage interconnecting the reservoir and the evaporator; a flow rate control unit inserted in the pressure liquid supply passage for controlling a flow rate of the low vapor pressure liquid material flowing through the pressure liquid supply passage; a vapor feed passage interconnecting the evaporator and the deposition chamber for flowing evaporated gas; and heating means disposed in the vapor feed passage for preventing the evaporated liquid material from re-liquefying.

According to the present invention of the above-described constitution, a low vapor pressure liquid material is pushed out of the reservoir in its liquid state by a pressure gas, a flow rate of the liquid material is controlled by the flow rate control unit to be supplied to the evaporator. In the evaporator the liquid material is vaporized on, e.g., the atomization principle to be fed to the deposition chamber in vapor through the vapor feed passage heated by the heating means, and a set processing is conducted there. Thus a low vapor pressure liquid material which is difficult to evaporate at the normal temperature and under the normal pressure can be supplied to the deposition chamber stably and accurately.

In a case that the discharge passage is provided in the liquid material supply apparatus, the evaporator is brought into communication with the discharge passage immediately before start of a deposition to draw and discharge residual low vapor pressure liquid material in the evaporator, whereby a liquid material supply amount for deposition can be controlled with high accuracy. For maintenance of the evaporator, the flow rate controller, etc., the pressure liquid supply passage is brought into communication with the discharge passage, whereby the liquid residing in the passage and in the respective members can be discharged. Their maintenance can be efficiently conducted.

In a case that the purge liquid supply passage is provided, only the above-described draw and discharge out of the discharge passage still leaves a little residual liquid in the pressure liquid supply passage, etc. Then a purge liquid, e.g., alcohol or others, is flowed from the purge liquid supply passage from the purge liquid supply passage to solve and discharge residual liquid inside.

The pipes of the passages have high mechanical strength and a relatively small flow passage area, the liquid material has shorter residence time, and metal contamination of the liquid material can be accordingly decreased.

DETAILED DESCRIPTION OF THE PREFERRED EMBODIMENT

The liquid material supply apparatus and method according to one embodiment of the present invention, which supplies a liquid material to a film deposition chamber will be explained in good details with reference to the drawings attached hereto.

Figure 1:
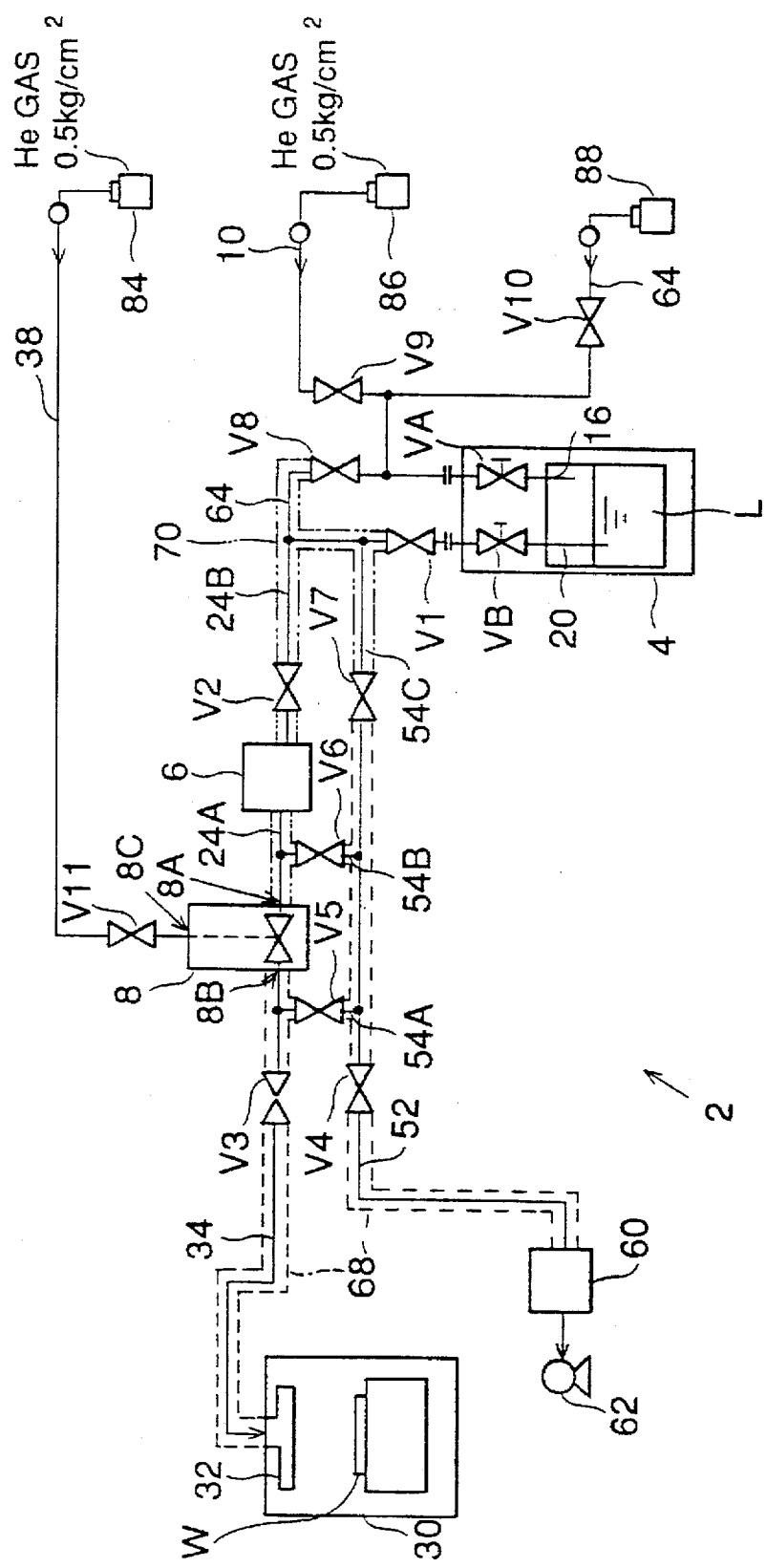
FIG. 1 is a general block diagram of the liquid material supply apparatus according to the present invention.
Figure 2:
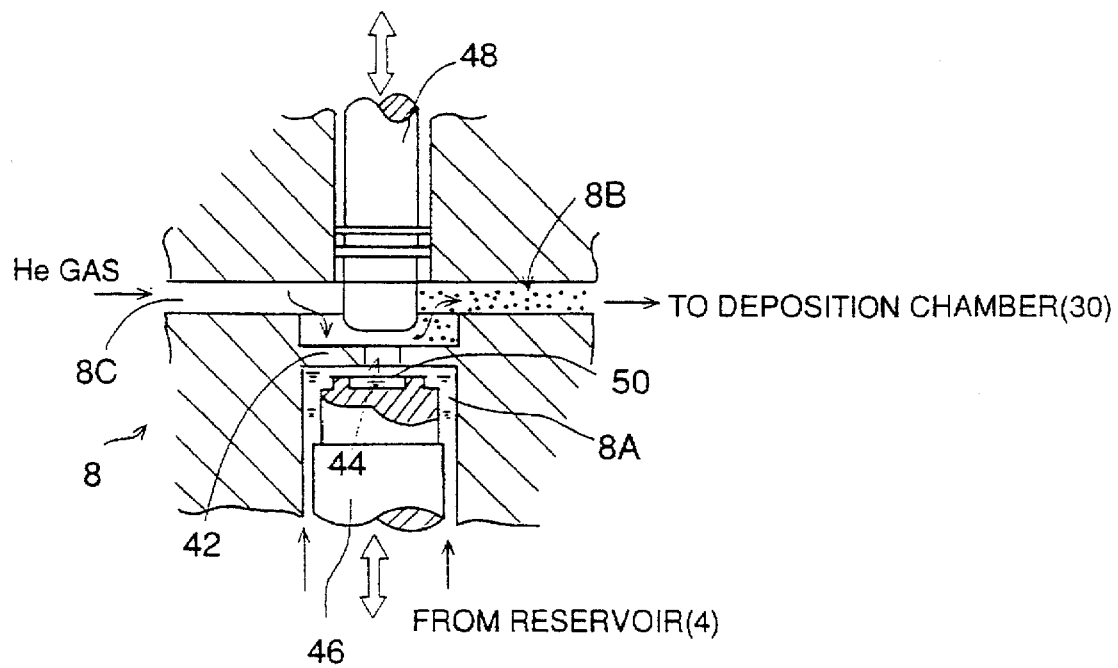
FIG. 2 is a diagrammatic vertical sectional view of the evaporator used in the liquid material supply apparatus of FIG. 1.
Figure 3:
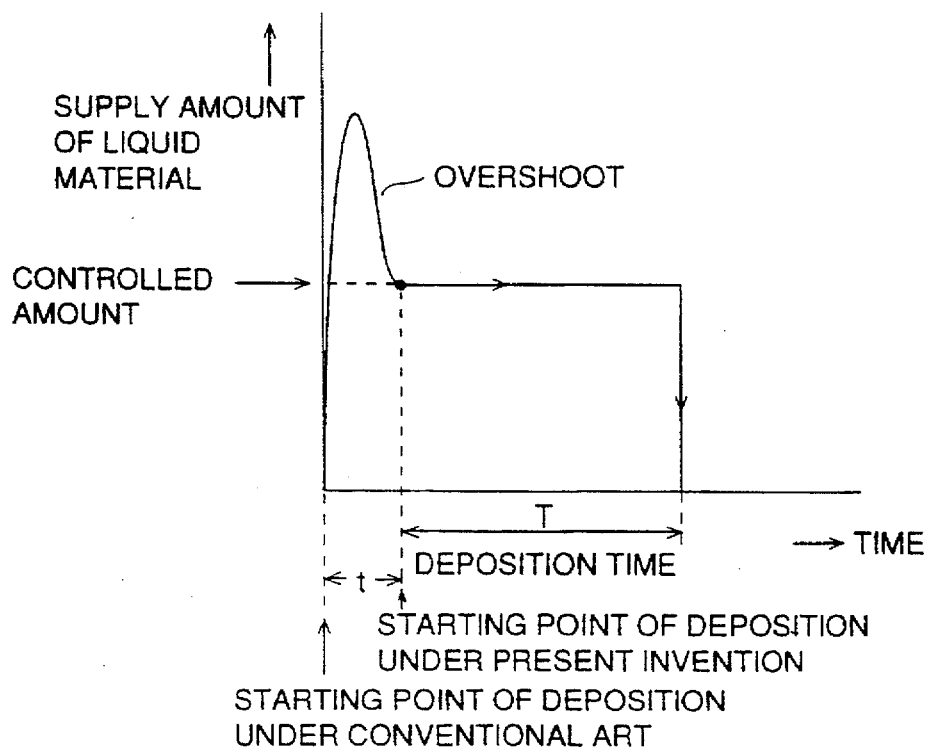
FIG. 3 is a graph of relationships between liquid material supply amounts for deposition and depositing time.
Figure 4A:
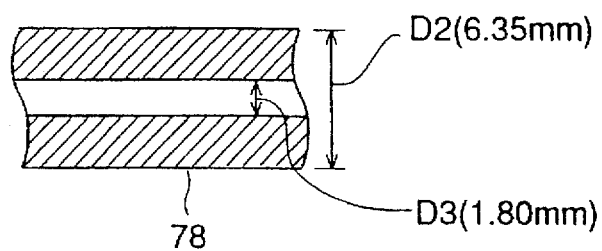
FIGS. 4A and 4B are vertical sectional views of a pipe structure of the vapor feed passage of the liquid material supply apparatus of FIG. 1.
Figure 4B:
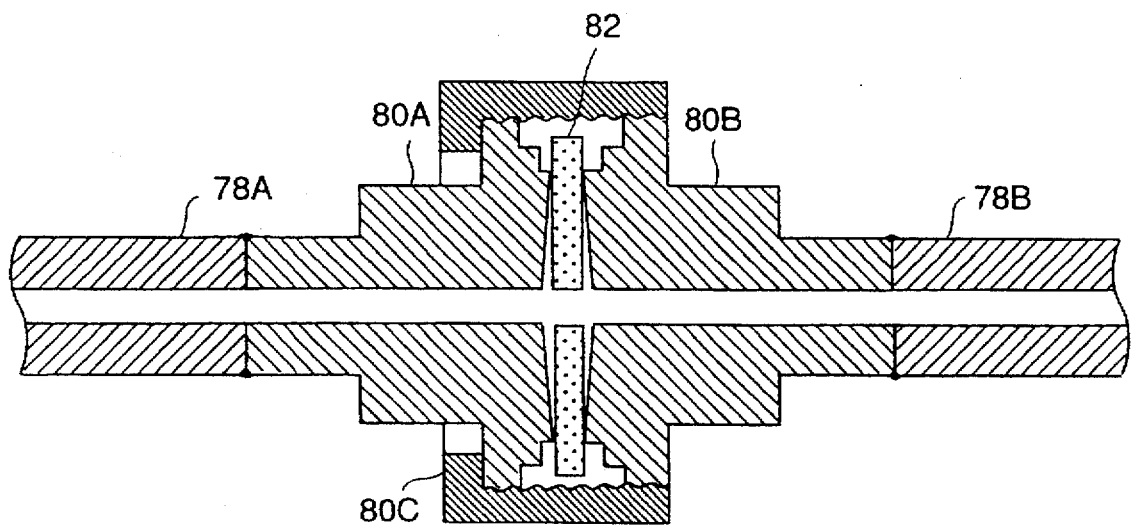
Figure 5:
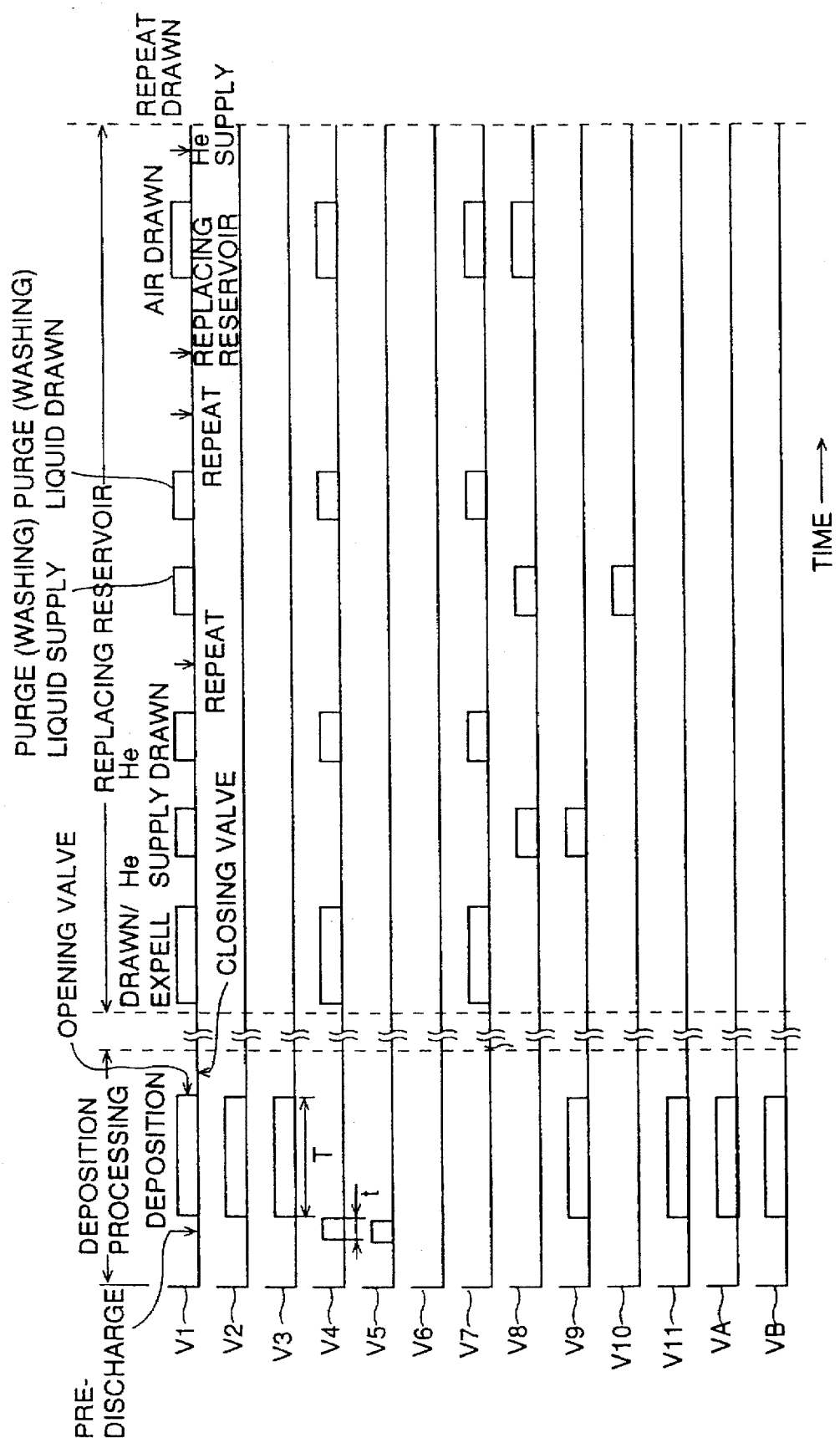
FIG. 5 is a time chart of operations (for deposition and reservoir replacement) of the respective valves of the liquid material supply.
Figure 6:
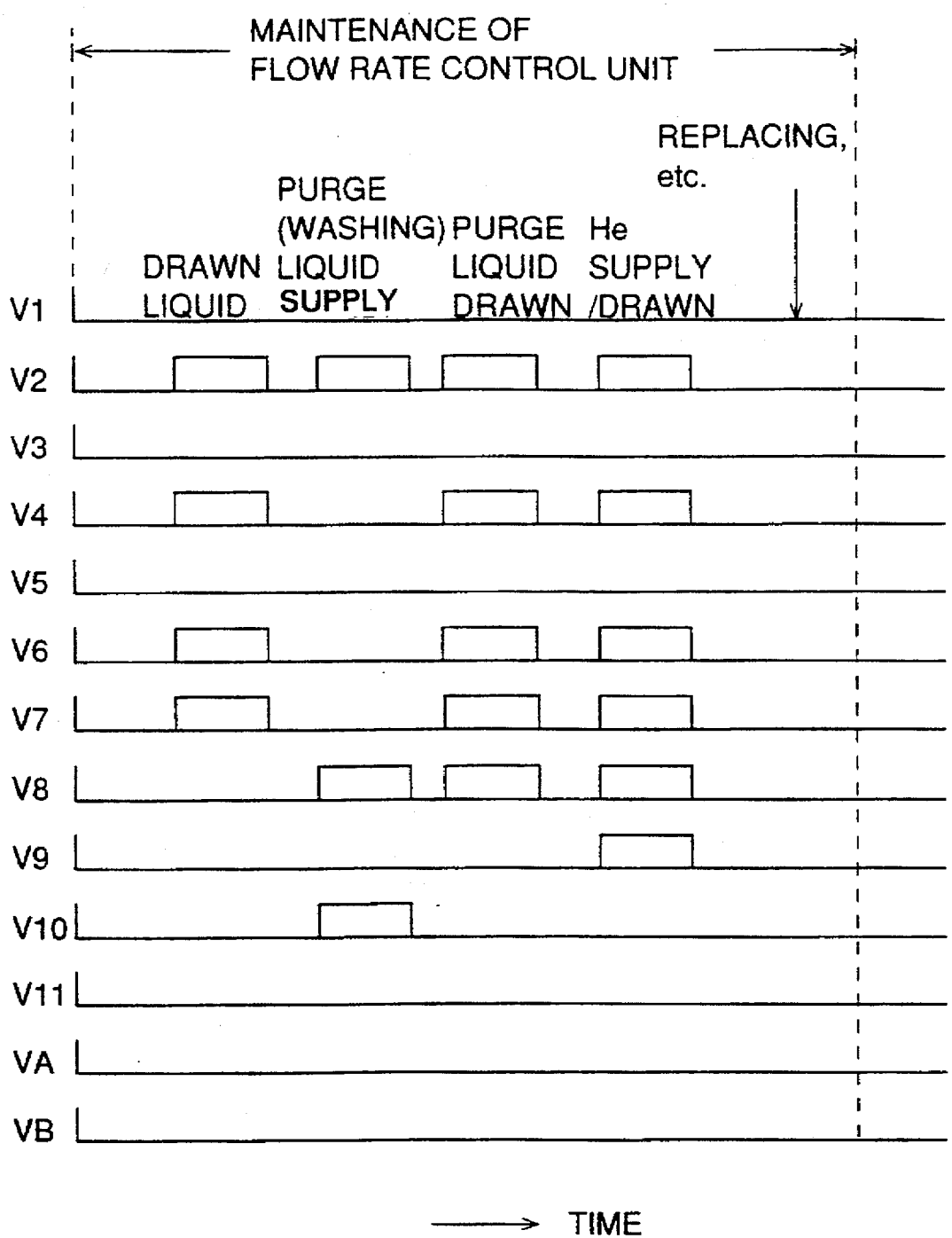
FIG. 6 is a time chart of operations (for maintenance of the flow rate control unit)) of the respective valves of the liquid material supply.

FIG. 1 is a block diagram of the liquid material supply apparatus according to the present invention. FIG. 2 is a diagrammatic sectional view of an evaporator used in the supply apparatus of FIG. 1. FIG. 3 is a graph of supply mounts of the liquid material for film deposition. FIGS. 4A and 4B are views showing a piping structure of the liquid material supply apparatus of FIG. 1. FIGS. 5 and 6 are time charts of operations of respective valves of the liquid material supply apparatus of FIG. 1.

As shown in FIG. 1, the liquid material supply apparatus 2 according to the present invention comprises a reservoir 4 which stores a low vapor pressure liquid material L which is liquid at the normal temperature and under the normal pressure, such as diethylaminotitanium (Ti[N(C$_2$H$_3$)$_2$]$_4$), trimethylvinylsilylfluorohexafluoroacetyle acetate copper or others, and a flow rate control unit 6 which controls the mass flow rate of the liquid material in liquid supplied from the reservoir 4, and an evaporator 8 which evaporates or atomizes a controlled flow rate of the liquid material on, e.g., the atomization principle.

The reservoir 4 includes a pressure gas introduction nozzle 16 with a first opening/closing valve VA and a liquid discharge nozzle 20 with a second opening/closing valve VB. The lower end of the introduction nozzle 16 is terminated above a liquid surface of the liquid material, and the lower end of the discharge nozzle 20 is located at a lower part in the liquid material.

A mouth ring on the upper end of the pressure gas introduction nozzle 16 of the reservoir 4 is connected to a pressurization passage 10 through which is supplied He gas, as a pressurization gas, having an adjusted pressure of, e.g., about 0.5 kg/cm$^2$, so that the liquid material L in the reservoir 4 can be pressurized by He gas introduced into the reservoir 4. A pressure gas supply/discharge valve V9 for controlling supply and discharge of the He gas is inserted in the pressurization passage 10.

The mouth ring on the upper end of the liquid discharge nozzle 20 and a liquid introduction port 8A are interconnected by a first pressure liquid supply passage 24A which supplies the pressure liquid material. The flow rate control unit 6 is inserted in the first pressure liquid supply passage 24A to control the flow rate of the liquid material. In the flow rate control unit 6 and the reservoir 4 there are inserted a first shut-off valve V1 and a second shut-off valve V2 which will be described later. The first and the second shut-off valves V1, V2 are necessary to shut off respective units for maintenance or other purposes.

A vapor outlet 8B of the evaporator 8 and a vapor feed nozzle 32 of a deposition chamber 30 where films are deposited on objects to be processed, e.g., semiconductor wafers are connected to a vapor feed passage 34 which supplies evaporated processing gas. The deposition chamber 30 is applicable to any deposition apparatus, e.g., plasma CVD apparatuses, usual CVD apparatuses, etc. The deposition chamber 30 is applicable to batch processing as well as sheet processing. In a case where the deposition chamber is a vacuum processing chamber, a vacuum pump is connected to the chamber, and in a case where the deposition chamber is a normal pressure processing chamber, a usual exhaust unit is connected to the deposition chamber. In the vapor feed passage 34 there is inserted a third shut-off valve V3 which will be explained later. The third shut-off valve V3 isolates the evaporator 8 from the rest of the units for the discharge of residual liquid and for other purposes.

An evaporation gas introduction port 8C of the evaporator 8 is connected to an evaporation gas passage 38 which supplied a high flow-rate gas for evaporation of the liquid. As an evaporation gas, He (or Ar) gas of, e.g., about 0.5 kg/cm$^2$ is flowed through the evaporation gas passage 38, and an evaporation gas shut-off valve V11 is inserted in the evaporation gas passage.

A structure of the evaporator 8 inserted in the vapor feed passage 34 will be detailed with reference to FIG. 2.

As described above, the evaporator 8 has the liquid introduction port 8A for the liquid to be introduced through, the evaporation gas introduction port 8C for an evaporation gas to be introduced through, and the vapor outlet 8B for the evaporated gas to be flowed through. A valve seat 42 is formed on the forward end of the liquid introduction port 8A, and a control valve body 46 is seated on the valve seat 42 near a fine valve port 44 or left from the valve seat 42 to thereby open and close the valve port 44. A shut valve body 48 which stops inflow of the evaporation gas (He gas) is provided opposite to the control valve body 46 across the valve seat 42. The shut valve body 48 and the control valve body 46 are left respectively from the valve port 44, whereby the liquid material which has flowed through the valve port 44 is exposed to the evaporation gas, high flow-rate He gas and evaporated, and flows in the evaporated state to the deposition chamber 30.

The evaporator 8 of this type has a dead space 50 unavoidably formed by its structure. Even when the valve port 44 is closed by the valve bodies 46, 48 to stop supply of the evaporation at the same time a deposition is over, a trace of the liquid material unavoidably resides in the dead space 50. When a next deposition is started with residual liquid material in the dead apace 50, the residual liquid material begins to flow simultaneously with the start of the deposition, and as shown in FIG. 3, a larger amount of the liquid material than a controlled amount thereof adversely is evaporated for, e.g., t seconds at the beginning of the deposition. Proper films cannot be deposited on wafers.

In view of this, according to the present invention, a discharge passage 52 is provided for discharging such residual liquid or discharging the residual liquid in the passages, etc. on maintenance (FIG. 1).

Specifically as shown in FIG. 1, the discharge passage 52 is connected to the vapor feed passage 34 between the evaporator 8 and the third shut-off valve V3, to the first pressure liquid supply passage 24A between the flow rate control unit 6 and the evaporator 8, and to the second pressure liquid supply passage 24B between the first shut-off valve V1 and the second shut-off valve V2 respectively through branched passages 54A, 54B, 54C. A first discharge shut-off valve V5, a second discharge shut-off valve V6 and a third discharge shut-off valve V7 are inserted respectively in the branched passages 54A, 54B, 54C. On the discharge side of the discharge passage 52 there are inserted a main shut-off valve V4, a cold trap 60 for removing liquid from exhaust, and a vacuum pump 62 in the stated order.

In the present embodiment, considering a case that the residual liquid, etc. cannot be sufficiently drawn off by draw through the discharge passage 52, a purge (washing) liquid supply passage 64 is connected to the second pressure liquid supply passage 24B through a pressurization passage 10 which can be disconnected by a valve operation. Purge (washing) liquids can be alcohol, such as ethanol, methanol, etc., and organic solvents, such as hexane, etc.

In the purge liquid supply passage 64 there is inserted a first purge liquid supply valve V10 which supplies and discharges purge liquid. A second purge liquid supply liquid V8 is inserted between the connection between the purge liquid supply passage 64 and the pressurization passage 10, and the connection between the purge liquid supply passage 64 and the second pressure liquid supply passage 24B.

Heating means 68, e.g., a tape heater or others (indicated by the dot lines) for incessant heating are provided at the parts of the respective passages, i.e., the vapor feed passage 34 from the evaporator 8, the branched passage 54 and the discharge passage 52, so that the evaporated gas is incessantly heated to prevent the evaporated gas from re-liquefying. At the pressure liquid supply passages 24A, 24B, and the second and the third branched passages 56B, 56C there are provided heating means 70, e.g., tape heaters or others for timely heating required for, e.g., liquid removal and maintenance.

Figure 7A:
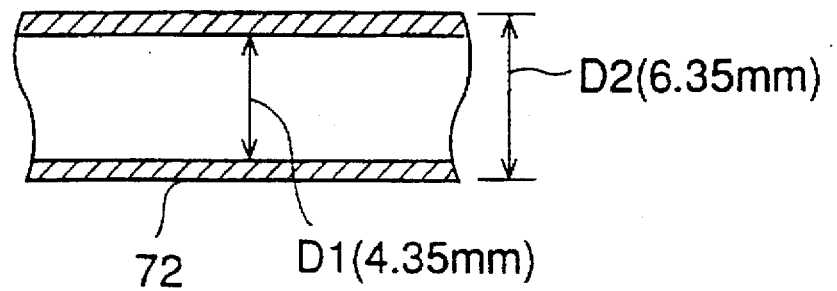
FIGS. 7A and 7B are vertical sectional views of the pipe structure conventionally used in the liquid material supply apparatus.
Figure 7B:
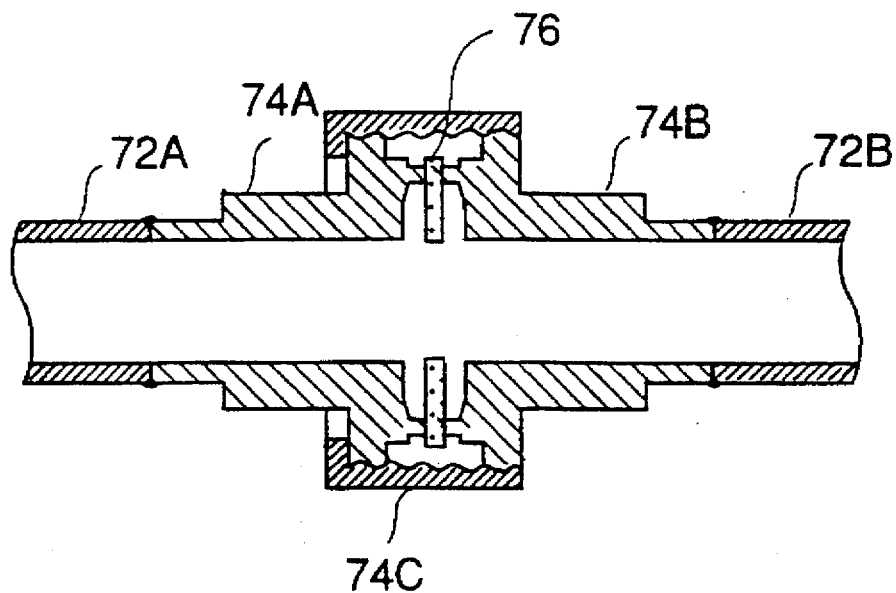

The piping 72 of the conventional apparatus for the gas supply generally uses the so-called ¼ inch stainless steel pipes 72 of a 4.35 mm-inner diameter D1, a 6.35 mm-outer diameter D2 and a 1.00 mm-thickness as shown in FIGS. 7A and 7B. These pipes 72 (72A, 72B) are connected by joints 74A, 74B fixed by a nut 74C and gaskets 76 of the same size to constitute a piping structure. But the ¼ inch pipe has an about 14.8 CC volume per 1 m. This volume is so large for an about 0.1 CC/minute of use for the deposition that the liquid material resides long in the piping on the way of the supply with a result of a problem of metal contamination. To solve this problem, use of ⅛ inch pipes of smaller outer and inner diameters can be considered, but the ⅛ inch pipes have low mechanical strength, which causes a safety problem in flowing organic metal-based liquid materials through the pipes.

In view of this, in the present embodiment, the piping structure as shown in FIGS. 4A and 4B is used in the piping of the above-described passages, especially in the piping of the pressure liquid supply passages 24A, 24B. That is, as shown in FIG. 4A, the pipe 78 has an 6.35 mm outer diameter D2, which is the same as that of the ¼ inch pipe and an 1.80 mm inner diameter D3, which is the same as that of the ⅛ inch pipe, and an about 2.5 CC volume per a 1 m length thereof, which is about ⅙ that of the ¼ inch pipe.

As shown in FIG. 4B, the couplings 80A, 80B fixed by a nut 80C and the gasket 82 have the same inner diameter (1.80 mm) as the above-described pipe. The couplings 80A, 80B are welded to the pipes 78A, 78B. The couplings 80A, 80B are so formed that the end surfaces are as perpendicular as possible so as to minimize a dead space defined between the joints 80A, 80B. Thus the pipes can have large thickness and a small volume per a unit length. In order that the pipe 78 has a required mechanical strength, preferably an inner diameter of the pipe 78 is within a range of 0.10–4.00 mm. Actually an optimum value is given based on a used amount of the liquid material for deposition and a residual amount of the liquid material in the entire piping. An inner diameter of the pipe 78 is 0.10 mm at minimum. This is because the pipe is difficult to machine. The pipe having an above 4.00 mm diameter provides a large flow passage area and an increased residence time such that the possibility of contamination is increased pipes of a less than 0.10 mm-inner diameter do not provide the desired mechanical strength.

In FIG. 1, reference numeral 84 and 86 indicate pressure He gas sources, and reference numeral 88 denotes a purge liquid source.

Then, the method for using the liquid material supply apparatus according to the present invention having the above-described structure.

First a case that a liquid material for deposition is fed to the deposition chamber from the liquid material supply apparatus to conduct a deposition will be explained.

As described above, a trace, e.g., 0.1 CC/minute, of the liquid material is used for the general deposition. If even a trace of the liquid material resides in, e.g., the dead space 50 of the evaporator 8 (FIG. 2), the liquid material residue is fed, uncontrolled to the deposition chamber when the shut valve body 48 is opened at the start of the deposition and causes an unpreferable overshoot supply as shown in FIG. 3. In the present embodiment, the liquid material residue left at the end of a preceding deposition is expelled from the liquid material supply apparatus 2.

First, a semiconductor wafer W is set on a susceptor (not shown) in the deposition chamber 30 in FIG. 1. The wafer W is retained at a required processing temperature, and when low-pressure CVD is conducted, the evacuation system is driven to maintain a required processing pressure.

In this state, the deposition processing of FIG. 5 is conducted.

The rises of pulses indicate that the valves V1–V11, VA, VB are opened.

First, as shown in FIG. 5, the main opening/closing valve V4 of the discharge passage 52, and the first discharge shut-off valve V5 of the branched passage 54A upstream of the main opening/closing valve V4 are opened to communicate the discharge passage 52 with the evaporator 8 for t seconds. The discharge passage 52 is incessantly evacuated by the vacuum pump 62, so that when the shut valve body 48 in the evaporator 8 is opened, residual liquid material staying in the dead space 50 and other parts are pre-discharged through the discharge passage 52. A period of time of the pre-discharge may be a period of time in which the overshoot supply in the graph of FIG. 3 can be removed.

When the pre-discharge of the residual liquid material in the dead space 50 (see FIG. 2) is thus over, the main opening/closing valve 4 and the first discharge shut-off valve V5 are closed, and the first shut-off valve V1 and the second shut-off valve V2 of the pressure liquid supply passage 24B, and the second shut-off valve V2, and the third shut-off valve V3 of the processing gas feed passage 34 are opened, the first and the second opening/closing valves VA, VB of the reservoir 4 being opened, and the pressure gas supply/discharge valve V9 of the pressurization passage 10, and the evaporation gas shut-off valve V11 of the evaporation gas passage 38 being opened.

At this time, the control valve body 46 (see FIG. 2) of the evaporator 8 is opened.

Thus a liquid material L in the reservoir 4 is pushed out by pressure He gas and flows bit by bit through the pressure liquid supply passage 24B. The flow rate of this flow is controlled by the flow rate control unit 6. The liquid material L is atomized on the atomization principle by a relatively high flow rate carrier gas (He) flowing through the evaporation gas passage 38 and evaporated. The evaporated deposition material flows in vapor through the vapor feed passage 34 and introduced into the deposition chamber 30 to be deposited for a required period of time. At this time, the vapor feed passage 34 is incessantly heated by the heating means 68, e.g., a tape heater to prevent the liquid material from re-liquefying.

Thus according to the present embodiment, before a liquid material for deposition is actually flowed and fed, residual liquid material in the evaporator 8, etc. can be expelled. Accordingly a deposition gas supply amount for an actual deposition can be stably and accurately fed. As a result, films of good quality and characteristics can be formed.

A point of this pre-expelling operation is that there is no liquid material residue in the evaporator, etc. before an actual deposition. The pre-expelling operation need not be conducted immediately before a deposition, but may be conducted immediately after a preceding deposition is over.

Next, a method of replacing the reservoir will be explained with reference to FIG. 5.

The liquid material is generally an organic metal material. The organic metal material is very reactive and is readily oxidized or solidified in contact with air, which cause clogging of the piping. Accordingly it is very difficult to handle the mouth ring, etc. for connecting/disconnecting the reservoir which are readily exposed to air.

First, the first and the second opening/closing valves VA, VB of the reservoir 4 in FIG. 1 are closed to place the reservoir out of communication. The first shut-off valve V1 of the second pressure liquid supply passage 24B is closed, the second shut-off valve V2 thereof being opened. The first and the second discharge shut-off valves V5, V6 of the branched passages 54A, 54B communicated with the discharge passage 52 are closed, the first shut-off valve V7 of the branched passage 54C and the main opening/closing valve V4 being opened.

Thus, residual liquid material on the mouth ring of the pipe of the reservoir 4, and that on the mouth ring for connection between the second pressure liquid supply passage 24B and the reservoir 4 is drawn and expelled through the discharge passage 52.

Since there is a risk that removal of liquid material residue only by evacuation might still leave some of the residue in the discharge passage, the unremoved residue is pushed out by He gas. Next, to this end, first the main opening/closing valve V4 and the first shut-off valve V7 are closed to close the discharge passage 52, the pressure gas supply/discharge valve V9 of the pressure passage 10, and the second purge liquid supply valve V8 are opened to supply the He gas to the connection mouth ring of the reservoir 4 to push out residual liquid material.

Then, to discharge the He gas out of the system, the pressure gas supply/discharge valve V9 and the second purge liquid supply valve V8 are closed to shut off the He gas supply. Again the main opening/closing valve V4 of the discharge passage 52 and the first shut-off valve V7 are opened to evacuate the interior for evacuation of the previously supplied He gas, whereby a trace of residual liquid material is expelled. The He gas supply and the He gas discharge may be repeated the required number of times.

Generally the thus emptied reservoir 4 is replaced by a new one. Reaction of liquid material with a trace of air deteriorates qualities of some semiconductor devices, and the quality control must be thus severe. Even though liquid material residue has been expelled by He gas, liquid material stays on the inside wall of the piping, and sometimes it is necessary to remove the liquid material residue substantially thoroughly. To this end, a trace of liquid material staying on the inside walls of the piping, etc. is removed by a purge liquid, such as ethanol or others.

To this end, first the main opening/closing valve V4 of the discharge passage 52, and the first shut-off valve V7 are closed, the first and the second purge liquid supply valves V10, V8 are opened. Purge liquid is introduced to the connection mouth ring of the reservoir 4 to solve liquid material staying on the wall of the pipe. At this time, the first shut-off valve V1 is opened.

Then, to discharge the introduced purge liquid, the first and the second purge liquid supply valves V10, V8 are closed to stop the purge liquid supply. The main opening/closing valve V4 of the discharge passage 52, and the third discharge shut-off valve V7 are opened to draw and discharge through the discharge passage 52 the introduced purge liquid. Here the above-described purge liquid supply and discharge are repeated several times to make the removal of the residual liquid material more perfect.

Here all the valves including the first shut-off valve V1 are closed, and in this state the used reservoir 4 is replaced by a new one. At this time, a trace of air intrudes into the connection mouth ring of the new reservoir 4 and the connection mouth ring of the second pressure liquid supply passage 24B. It is not preferable to perform deposition in this state because the air flows into the passages.

Then an operation is made to remove a trace of air which has intruded into the connection mouth rings. With the first and the second opening/closing valves VA, VB of the reservoir closed, the first shut-off valve V1, the second purge liquid supply valve V9, the main opening/closing valve V4 and the third discharge shut-off valve V7 of the discharge passage 52 are opened to draw and remove the air intruded into the two connection mouth rings of the reservoir 4.

Cases where even a trace of air stays on the inside wall of the piping take place. For perfect removal of the air, with the discharge passage 52 closed, He gas is supplied to the connection mouth rings to expel the air. This operation is repeated.

Thus, liquid material residue in the piping is removed, the liquid material residue is pushed out by an inert gas (He), the inside wall of the piping is cleaned if necessary, whereby the reservoir can be replaced without contacting liquid material residue in the piping directly with air. Accordingly a liquid material which is reactive is kept from contact with air, so that occurrence of clogging of the piping with byproducts can be precluded.

Then, a method of drawing liquid material for maintenance of the evaporator 8 and the flow rate control unit 6 will be explained with reference to FIG. 6.

For an example, maintenance of the flow rate control unit in FIG. 1 will be explained. The second shut-off valve V2 of the second pressure liquid supply passage 24B, the main opening/closing valve V4 and the second and the third discharge shut-off valves V6, V7 are opened to isolate the flow rate control unit 6. Liquid material residue in the flow rate control unit 6 and in the pipes connected thereto is drawn and removed.

Then, in the state where the discharge passage 52 is shut off with the main opening/closing valve V4, and the second and the third discharge shut-off valves V6, V7 closed, the first and the second purge liquid supply valves V10, V8 are opened to flow purge liquid through the flow rate control unit 6 to solve liquid material staying on the inside wall, etc. of the flow rate control unit 6. Prior to this purging operation, He gas may be supplied and discharged.

Then, to remove the purge liquid, the first purge liquid supply valve V10 is closed to shut off supply of the purge liquid. The main opening/closing valve V4, and the second and the third discharge shut-off valves V6, V7 of the discharge passage 52 are opened to draw and remove the purge liquid.

To ensure the removal of the purge liquid, next the removal by the He gas may be conducted. To this end, in the above-described state, the pressure gas supply/discharge valve V9 is opened to flow He gas into the flow rate control unit 6 to expel the purge liquid. In this case, the third discharge shut-off valve V7 is closed in the operation to flow He gas concentratively into the flow rate control unit 6. The discharge efficiency can be improved. When the liquid material removal and cleaning is over, all the valves are closed for maintenance of the flow rate control unit 6.

To maintain the evaporator 8, the first discharge shut-off valve V5 is opened and the second discharge shut-off valve V6 is closed.

Thus, for maintenance of a member located in a passage, the member is isolated from the rest of the units so as to avoid contact of liquid material residue in the passage with air.

The valve operations in the above-described embodiment are examples, and any valve operation can be used as long as the valve operation can discharge liquid material residue and air in the respective passages and, if necessary, can clean the passages with a purge liquid.

The first and the second opening/closing valves VA, VB of the reservoir 4 are manually operated, but the other valves may be manually or automatically operated. In using the apparatus according to the present invention, the heating means 68 provided in the processing vapor feed passage 34, the discharge passage 52 and the branched passage 54A are incessantly operated in an operation for heating to prevent deposition materials from re-liquefying. The heating means 70 provided in the second pressure liquid supply passage 24B and the branched passages 54B, 54C is operated for heating only when required for discharge of liquid material, maintenance, etc.

The respective passage of the apparatus of the present invention, especially the pressure liquid supply passages 24A, 24B for a deposition material to flow in liquid are constituted by pipes 78 having, as shown in FIG. 4, high mechanical strength and a very small flow passage area. When a liquid material is fed for deposition, the liquid material stays in the pipes for a shorter period of time which is about ⅙ that of the conventional apparatus. Accordingly the liquid material is less liable to be contaminated with metal materials of the pipes. Quality of films can be accordingly improved. The piping structure of the present invention can be used to flow various fluids, and is applicable to gaseous materials, e.g., gases as well as liquid materials.

In the above-described embodiment, He gas is used as a carrier gas and a pressure gas, and these gases are not limited to He gas. Other inert gases, such as Ar gas, $N_2$ gas, etc, may be used.

The object to be processed is not limited to semiconductor wafers. It is needless to say that other materials, e.g., LCD substrates, glass substrates, etc. can be used. The deposition chamber is applicable to either of sheet processing, batch processing, etc.

As described above, the present invention can provide the following excellent functional advantageous effects.

A low vapor pressure liquid material as a deposition material can be fed into the deposition chamber at an accurately controlled flow rate. Films of good quality can be formed.

Because of the discharge passage, liquid material residue in the evaporator can be expelled before the start of a deposition. Occurrence of overshoots of a liquid material supply amount can be precluded in deposition, whereby the deposition material can be fed stably and accurately, and higher quality films can be formed.

Because of the discharge passage and the purge liquid supply passage, liquid material in the passages can be substantially perfectly expelled without contact of the liquid material with air for maintenance of the respective members and replacement of the reservoir. Accordingly production of byproducts by oxidation of the liquid material, and clogging of the passages with the byproducts can be precluded. Liquid material supply can be stable.

The passages are made of pipes of high mechanical strength and a small flow area. The liquid material has accordingly shorter residence time in the passages, and occurrence of metal contamination is accordingly precluded. Films can have high quality.

We claim:

1. A deposition liquid material supply apparatus for supplying through pipes a low vapor pressure liquid material for deposition to a deposition chamber for depositing films on objects to be processed, the apparatus comprising:

a reservoir for storing the low vapor pressure liquid material;

an evaporator for exposing the low vapor pressure liquid material to a high flow rate gas to evaporate the liquid material;

a pressurization passage for pushing out the low vapor pressure liquid material by a pressure gas separately supplied by means connected to the reservoir;

a pressure liquid supply passage interconnecting the reservoir and the evaporator;

a flow rate control unit inserted in the pressure liquid supply passage for controlling a flow rate of the low vapor pressure liquid material flowing through the pressure liquid supply passage;

a vapor feed passage interconnecting the evaporator and the deposition chamber for flowing evaporated gas; and heating means disposed in the vapor feed passage for preventing the evaporated liquid material from reliquefying, wherein the pressure liquid supply passage and the vapor feed passage are connected to a discharge passage for low vapor pressure liquid material residue and gas residue in the pressure liquid supply passage and the evaporator through respective discharge shut-off valves, and the pressure liquid supply passage is connected to a purge liquid supply passage with a purge liquid supply valve inserted therein so as to clean the interior of the pressure liquid supply passage with a purge liquid when required, and discharge the used purge liquid through the discharge passage.

2. The liquid material supply apparatus according to claim 1, wherein the discharge passage has heating means for preventing the gas flowing therethrough from re-liquefying.

3. The liquid material supply apparatus according to claim 1, wherein said pressure liquid supply passage includes a piping structure with a pipe diameter of about 6.35 mm, and an inner diameter of about 0.10–4.00 mm which dimensioning ensures required strength and a relatively small flow passage area.

4. The liquid material supply apparatus according to claim 3, wherein said vapor feed passage has the same pipe size as said pressure liquid supply passage.

5. The liquid material supply apparatus according to claim 1, wherein said pressure liquid supply passage includes a piping structure with a pipe diameter of about 6.35 mm, and an inner diameter of about 0.10–4.00 mm which dimensioning ensures required strength and a relatively small flow passage area, and said discharge and vapor feed passage have the same pipe size as said pressure liquid supply passage.

* * * * *